United States Patent
Mandelman et al.

(10) Patent No.: US 6,335,248 B1
(45) Date of Patent: Jan. 1, 2002

(54) DUAL WORKFUNCTION MOSFETS WITH BORDERLESS DIFFUSION CONTACTS FOR HIGH-PERFORMANCE EMBEDDED DRAM TECHNOLOGY

(75) Inventors: Jack A. Mandelman, Stormville; Thomas Walter Dyer, Pleasant Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/845,665

(22) Filed: Apr. 30, 2001

(51) Int. Cl.[7] .............................................. H01L 21/336
(52) U.S. Cl. ........................ 438/279; 438/241; 438/592
(58) Field of Search ................................ 438/210, 241, 438/275, 279, 283, 587, 592

(56) References Cited

U.S. PATENT DOCUMENTS

| | | | |
|---|---|---|---|
| 6,194,301 B1 * | 2/2000 | Radens et al. | 438/241 |
| 6,037,247 A | 3/2000 | Anand | 438/279 |
| 6,235,574 B1 * | 5/2000 | Tobben et al. | 438/241 |
| 6,087,225 A | 7/2000 | Bronner et al. | 438/275 |
| 6,087,234 A | 7/2000 | Wu | 438/592 |
| 6,100,173 A | 8/2000 | Gardner et al. | 438/592 |
| 6,136,677 A | 10/2000 | Prein | 438/592 |
| 6,153,476 A | 11/2000 | Inaba et al. | 438/279 |

* cited by examiner

*Primary Examiner*—Chandra Chaudhari
(74) *Attorney, Agent, or Firm*—Scully, Scott, Murphy & Presser; Joseph P. Abate

(57) ABSTRACT

The present invention provides a method for forming dual workfunction metal oxide semiconductor field effect transistors (MOSFETs) which utilizes processing steps that solve the problem of doping the dual work function MOSFETs, while providing contacts to the diffusion regions which are borderless to the gate conductors. Specifically, the present invention provides a method wherein a self-aligned insulating gate cap is formed on top of a previously defined and doped gate conductor region. The inventive method which forms an insulating cap that is self-aligned to an underlying gate conductor enables the formation of dual workfunction gate conductors and borderless diffusion contacts without the need of employing separate block masks as required by prior art processes.

22 Claims, 14 Drawing Sheets

DUAL WORKFUNCTION MOSFETS WITH BORDERLESS DIFFUSION CONTACTS FOR HIGH-PERFORMANCE EMBEDDED DRAM TECHNOLOGY

FIELD OF THE INVENTION

The present invention relates to semiconductor device manufacturing, and more particularly to a method of fabricating a dual workfunction metal oxide semiconductor field effect transistor (MOSFET) in which the problem of defining dual workfunction gate doping is solved, while providing contacts to the source/drain diffusions which are borderless to the gate conductors. The dual workfunction MOSFETs of the present invention can be used for high-performance memory applications such as embedded dynamic random access memory (DRAM) cells.

BACKGROUND OF THE INVENTION

In the field of semiconductor device manufacturing, MOSFETs having borderless contacts are generally fabricated by forming a gate stack that is capped with an insulator on a surface of a semiconductor substrate and then defining the gate conductors by etching through all the layers of the gate stack. Such a process is amendable for forming N+ doped gate conductors wherein the gate doping is provided prior to the formation of the insulating cap. In order to provide dual workfunction doping on a selective basis, the insulating layer over the gate stack must be selectively removed from the support regions of the device. This requires an additional masking step to block regions wherein the insulating cap is desired to be retained for the formation of borderless diffusion contacts in the array. Therefore, typical prior art processes do not allow dual workfunction gates with borderless contacts in the support regions.

FIG. 1 shows a prior art structure which is formed utilizing the above-mentioned prior art process. Specifically, FIG. 1 shows a structure comprising semiconductor substrate 10 having patterned gate dielectric 12 formed thereon. On top of portions of gate dielectric 12 are gate stacks 14 which each include lower conductive portion 16 and upper insulating portion 22. The lower conductive portion comprises N+ polysilicon region 18 and refractory metal silicide region 20. An optional barrier layer (not shown) may be present between regions 18 and 20. Spacers 24 are formed on exposed sidewalls of each gate stack and on top of gate dielectric 12. Borderless diffusion contact 26 is formed between adjacent gate stacks so as to contact one of the diffusion regions (labeled as 28 in FIG. 1) which is present in semiconductor substrate 10.

Specifically, the prior art structure of FIG. 1 is formed by first depositing conductive layers (i.e., N+ polysilicon and refractory metal silicide) on the gate dielectric and thereafter forming an insulating layer such as SiN on the refractory metal silicide layer prior to etching the gate stack. Following the formation of the insulating spacers, a contact to one of the diffusion regions of the MOSFET which overlaps the gate conductor may be formed. The structure shown in FIG. 1 as well as the method that is employed in fabricating the same is commonly employed in current DRAM technology wherein a single-gate workfunction is used (i.e., buried-channel PMOSFETs) with borderless diffusion contacts in the array.

As stated above, the prior art process requires predoping of the gate conductor in the array, while blocking the supports if dual workfunction is required. Dual workfunction gate doping in the supports (without any borderless contacts) is achieved by selective removal of the insulating cap followed by doping of the gate conductor. Thus, in the prior art, application of two block masks are required to fabricate dual workfunction MOSFETs in the support regions; (1) for blocking the array gate doping from the supports; and (2) for blocking the array during removal of the insulating gate cap from the supports.

With decreasing groundrules, scalability of the channel length of buried-channel PFET is severely limited by short-channel effects (i.e., the decrease of threshold voltage in short-channel devices caused by two-dimensional electrostatic charge sharing between the gate and the source/drain diffusion regions). This requires the use of dual workfunction (i.e., surface channel) MOSFETs, while allowing the formation of borderless contacts in the array. The need for dual workfunction MOSFETs with borderless diffusion contacts is of utmost importance for high-performance logic containing high-density DRAMs.

U.S. Pat. No. 5,937,289 to Bronner, et al. discloses a process for providing dual workfunction gates, each gate having a self-aligned insulating top layer. In the −289 patent, the entire gate stack is formed prior to etching and doping is introduced into the etched gate stack through the sidewalls thereof.

U.S. application Ser. No. 09/325,941, filed Jun. 4, 1999 provides a method for fabricating dual workfunction gates wherein each gate has a self-aligned insulating top layer. In the '941 application, the entire gate stack is defined before etching and doping occurs through ledges that are present on partially etched gate stacks.

Despite the processes described in the prior art, there is a continued need of providing a method that solves the problem of defining dual workfunction gate doping, while providing contacts to the source/drain diffusion regions which are borderless to the gate conductor. As such, a method which is capable of solving the above-mentioned problem is required and would represent a significant advancement in the field of semiconductor device manufacturing.

SUMMARY OF THE INVENTION

One object of the present invention is to provide a method of fabricating a dual workfunction MOSFET.

Another object of the present invention is to provide a method of fabricating a dual workfunction MOSFET in which borderless diffusion contacts are present in both the array and support device regions of the integrated semiconductor structure.

A still further object of the present invention is to provide a method of fabricating a dual workfunction MOSFET wherein the gate conductors are defined and doped prior to the formation of an insulating cap thereon.

A yet further object of the present invention is to provide a method of fabricating a dual workfunction MOSFET with borderless diffusion contacts in which the two block masks required in prior art processes are eliminated thereby reducing the cost of manufacturing the same.

An even further object of the present invention is to provide a method of fabricating a dual workfunction MOSFET with borderless diffusion contacts wherein the height of the gate stack is reduced thereby improving the width-tolerance of the gate conductor.

An additional object of the present invention is to provide a method of fabricating a dual workfunction MOSFET with borderless diffusion contacts in which the device has reduced capacitance relative to prior art devices.

These and other objects and advantages are achieved in the present invention by employing a method wherein a self-aligned insulating gate cap is formed on top of a previously defined and doped gate conductor region. The inventive method which forms an insulating cap that is self-aligned to an underlying gate conductor enables the formation of dual workfunction gate conductors and borderless diffusion contacts without the need of employing separate block masks as required by prior art processes.

Specifically, the method of the present invention comprises the steps of:

(a) providing a semiconductor structure which includes at least one array device region and at least one support device region, wherein each of said regions includes patterned polysilicon gate conductors, and salicide regions formed over at least diffusion regions that are formed in a surface of a semiconductor substrate between said patterned polysilicon gate conductors;

(b) forming a material stack on said semiconductor structure, said material stack comprising a bottom nitride layer formed on all exposed surfaces of said semiconductor structure, a polysilicon layer formed on said bottom nitride layer, and a top nitride layer formed on said polysilicon layer, (c) forming a planarizing material on said material stack and planarizing said planarizing material so as to expose said top nitride layer that is present above said patterned polysilicon gate conductors;

(d) removing exposed portions of said top nitride layer so as to expose portions of said polysilicon layer that is present above said patterned polysilicon gate conductors;

(e) removing said planarizing material and forming an oxide region on exposed portions of said polysilicon layer that is present above said patterned polysilicon gate conductors;

(f) removing said top nitride layer and said polysilicon layer that abut said oxide region so as to expose said first nitride layer of said material stack;

(g) forming oxide spacers abutting said patterned polysilicon gate conductors;

(h) forming a third nitride layer on all exposed surfaces of said semiconductor structure;

(i) forming a planarized layer of glass material on said third nitride layer;

(j) providing an opening in said semiconductor structure between adjacent patterned polysilicon gate conductors in said at least one array device region so as to expose said salicide region formed on one of said diffusion regions; and (k) forming a borderless diffusion contact within said opening.

DETAILED DESCRIPTION OF THE PRESENT INVENTION

Figure 1:
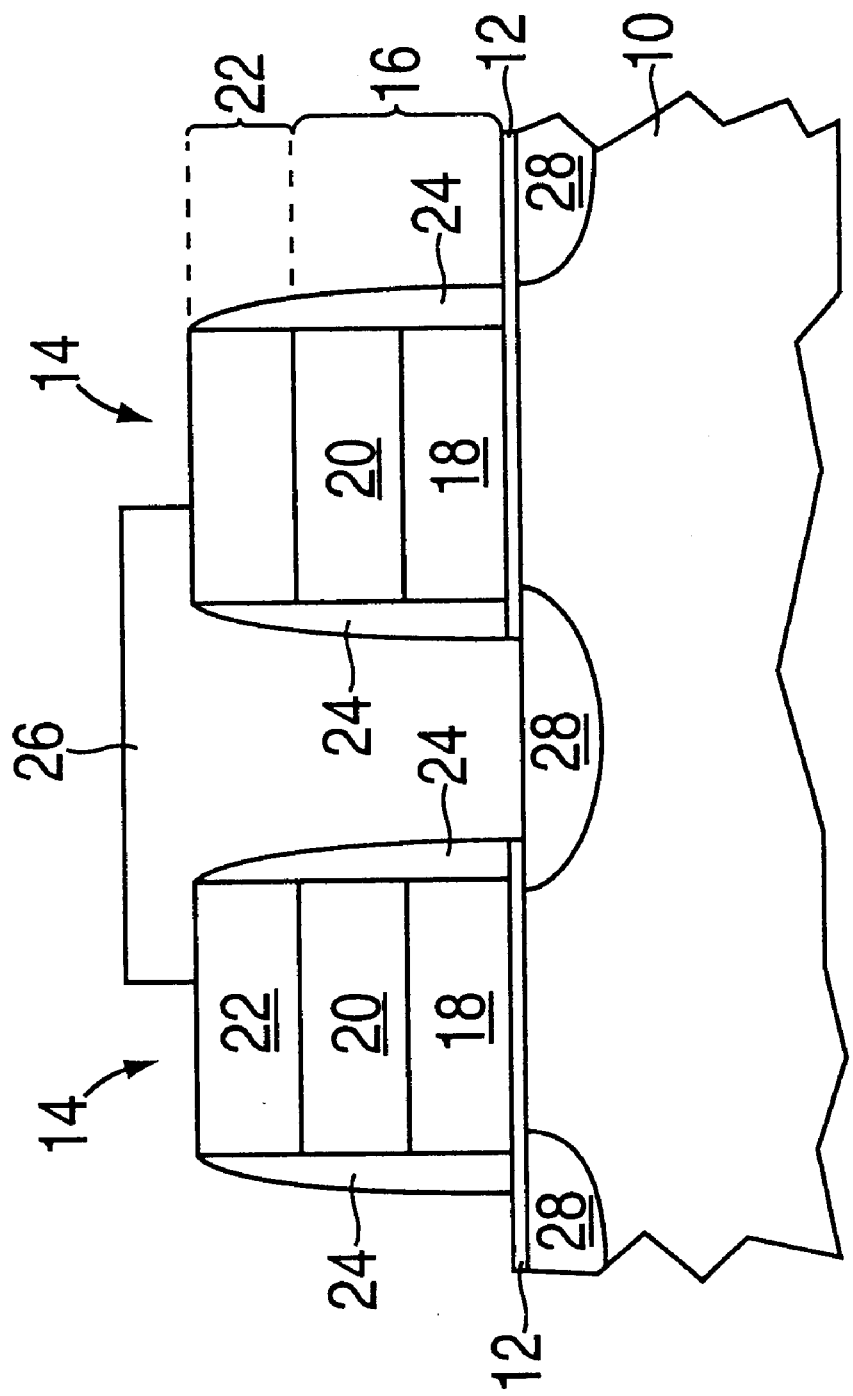
FIG. 1 is a pictorial representation (through a cross-sectional view) of a prior art MOSFET structure wherein the gate conductor cap is formed on a predoped gate stack prior to etching the gate stack.

The present invention, which provides a method of fabricating dual workfunction MOSFETS with borderless diffusion contacts, will now be described in more detail by referring to the drawings that accompany the present application.

Figure 2:
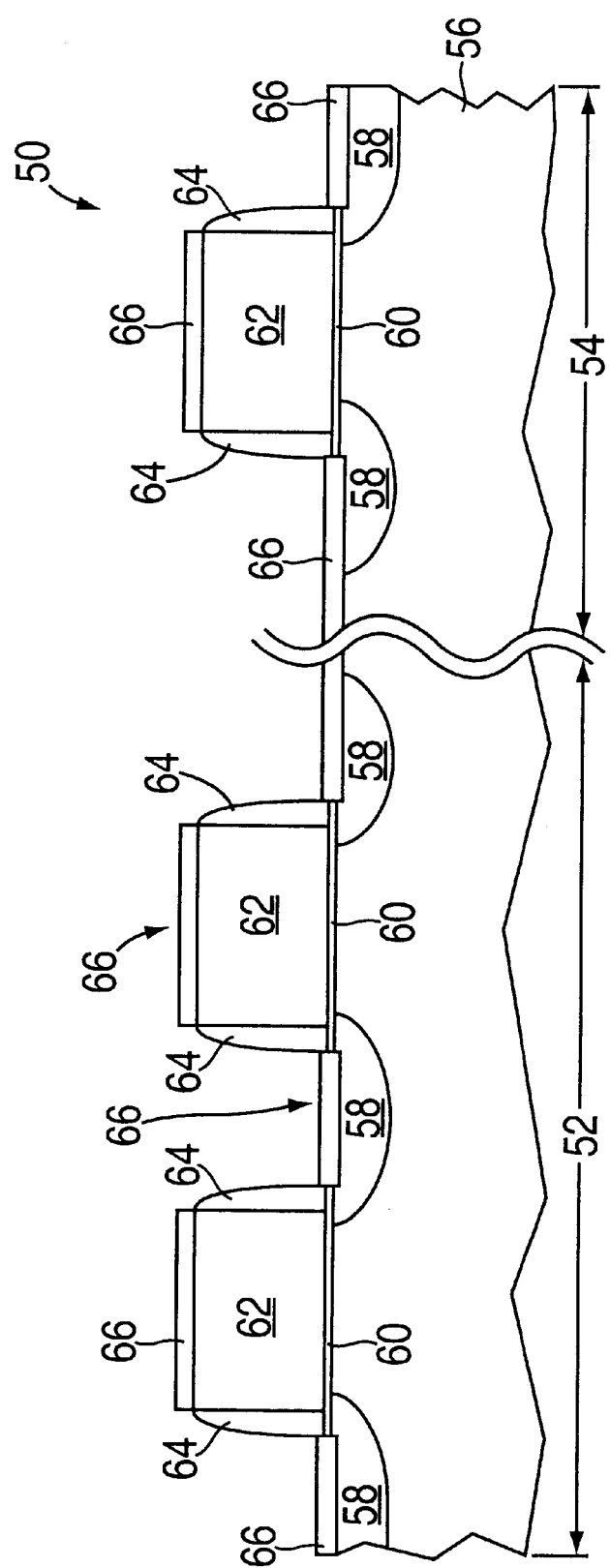
FIGS 2–14 are pictorial representations (through cross-sectional views) of the various processing steps that are employed in the present invention in forming dual workfunction MOSFETs with borderless diffusion contacts.

Reference is first made to FIG. 2 which shows an initial structure that is employed in the present invention. The initial structure shown in FIG. 2 comprises semiconductor structure 50 which includes at least one array device region 52 and at least one support device region 54. The at least one array device region is that region of the structure which benefits from longer channel lengths. Thus, the array device region typically contains the DRAM capacitors (and hence access transistors of the capacitors). These circuits operate at higher voltages than the support device regions which generally (but not always) operate at lower voltages and consist of higher performance transistors. Although the drawings of the present application depict only one of each device region therein, the present invention works equally well when a plurality of array device regions and support device regions are present in the structure.

It is noted that the structure shown in FIG. 2 may also include a core circuit device region between the array and support device regions which includes wordline drivers, sense amplifiers, decoders, and other like devices. The core device region is more akin to the array device region in that it benefits from longer channels and can operate at higher voltages than the support device regions.

The semiconductor structure shown in FIG. 2 also comprises semiconductor substrate 56 which includes diffusion, i.e., source/drain, regions 58 formed therein, patterned gate dielectric 60 formed on portions of semiconductor substrate 56, patterned polysilicon gate conductors 62 formed on portions of patterned gate dielectric 60, insulating sidewall spacers 64 formed on exposed sidewalls of each of the patterned polysilicon gate conductors; and salicide regions 66 formed on top of each of the patterned polysilicon gate conductors and over each of the diffusion regions.

The structure shown in FIG. 2 is fabricated utilizing processing techniques well known in the art and the structure is composed of conventional materials that are also well known to those skilled in the art. For example, semiconductor substrate 56 comprises any semiconducting material including, but not limited to: Si, Ge, SiGe, GaAs, InAs, InP and all other III/V semiconductor compounds. Layered substrates comprising the same or different semiconductor material, e.g., Si/SiGe and silicon-on-insulators (SOIs), are also contemplated herein. The substrate may be of the n- or p-type depending on the desired device to be fabricated. The substrate may contain active device regions, wiring regions, isolation regions or other like regions. For clarity, these regions are not shown in the drawings, but are nevertheless intended to be included within substrate 56.

Gate dielectric 60 which comprises an oxide, nitride, oxynitride or combinations thereof is formed on the surface of substrate 56 utilizing a conventional thermal growing process (i.e., oxidation, nitridation, or oxynitridation), or alternatively, the gate dielectric may be formed by a conventional deposition process such as chemical vapor deposition (CVD), plasma-assisted CVID, sputtering, evaporation and other like deposition processes. The thickness of the gate dielectric is not critical to the present invention. Illustrative examples of suitable gate dielectrics include, but are not limited to: SiN, SiON, $SiO_2$, $Ta_2O_5$, $Al_2O_3$ or combinations thereof A polysilicon layer is formed on the surface of gate dielectric 60 utilizing a conventional deposition process such as CVD or plasma-assisted CVD. Following deposition of the polysilicon layer, the deposited polysilicon may be doped with an appropriate dopant, or alternatively, an in-situ doping deposition process is employed in forming the polysilicon layer. Note that it is also possible to delay doping of the polysilicon layer until the diffusion regions are formed in the structure. The latter doping is preferred in the present invention since it reduces the thermal budget of the overall process. The thickness of the polysilicon layer may vary and is also not critical to the present invention.

Following formation of the polysilicon layer, conventional lithography and etching is employed in forming patterned polysilicon gate conductors 62 on portions of the gate dielectric. The lithography step includes applying a conventional photoresist (not shown in the drawings) to the surface of the polysilicon layer, exposing the photoresist to a pattern of radiation and developing the pattern by utilizing a conventional resist developer. The etching step used in the present invention in transferring the pattern to the polysilicon layer includes any dry etching process such as reactive-ion etching (RIE), ion beam etching or plasma-etching. The photoresist used in forming the patterned polysilicon gate conductors in the structure is thereafter removed by utilizing a conventional stripping process well known to those skilled in the art.

At this point, each of patterned polysilicon gate conductors 62 is subjected to a thermal growing process which is capable of forming insulating sidewall spacers 64 on the exposed sidewalls of the patterned polysilicon regions. Specifically, the insulating sidewall spacers which comprise an oxide, a nitride or oxynitride, may be formed by a thermal oxidation, nitridation or oxynitridation process, or alternatively, the insulating sidewall spacers may be formed by deposition of an insulating layer and etching. Note that the sidewall spacers are formed atop of the gate dielectric.

With insulating sidewall spacers 64 in place, the structure is subjected to conventional ion implantation and activating annealing processes which are capable of forming diffusion regions 58 in semiconductor substrate 56. Note that in a preferred embodiment of the present invention, this step of the present invention also serves to dope the patterned polysilicon regions.

Next, the gate dielectric not protected by patterned polysilicon gate conductors 62 and insulating sidewall spacers 64 is removed by a conventional etching process that is highly selective in removing gate dielectric as compared with insulating sidewall spacers and substrate material. Preferably, an anisotropic etching process is used to pattern the gate dielectric. Note that the etching process exposes portions of the substrate.

A conventional salicide process well known to those skilled in the art is then employed so as to form salicide regions 66 on the exposed surfaces of the substrate as well as the patterned polysilicon gate conductors forming the structure shown, for example, in FIG. 2. The salicide process employed in the present invention includes applying a refractory metal such as Co, W, Ti, or Mo onto the exposed Si-containing surfaces of the structure, i.e., on substrate 56 and patterned polysilicon gate conductors 62, heating said structure to a temperature of about 700° C. or above for a time period of about 30 seconds or less, and thereafter removing any refractory metal that is not converted to a salicide by the heating step.

Figure 3:
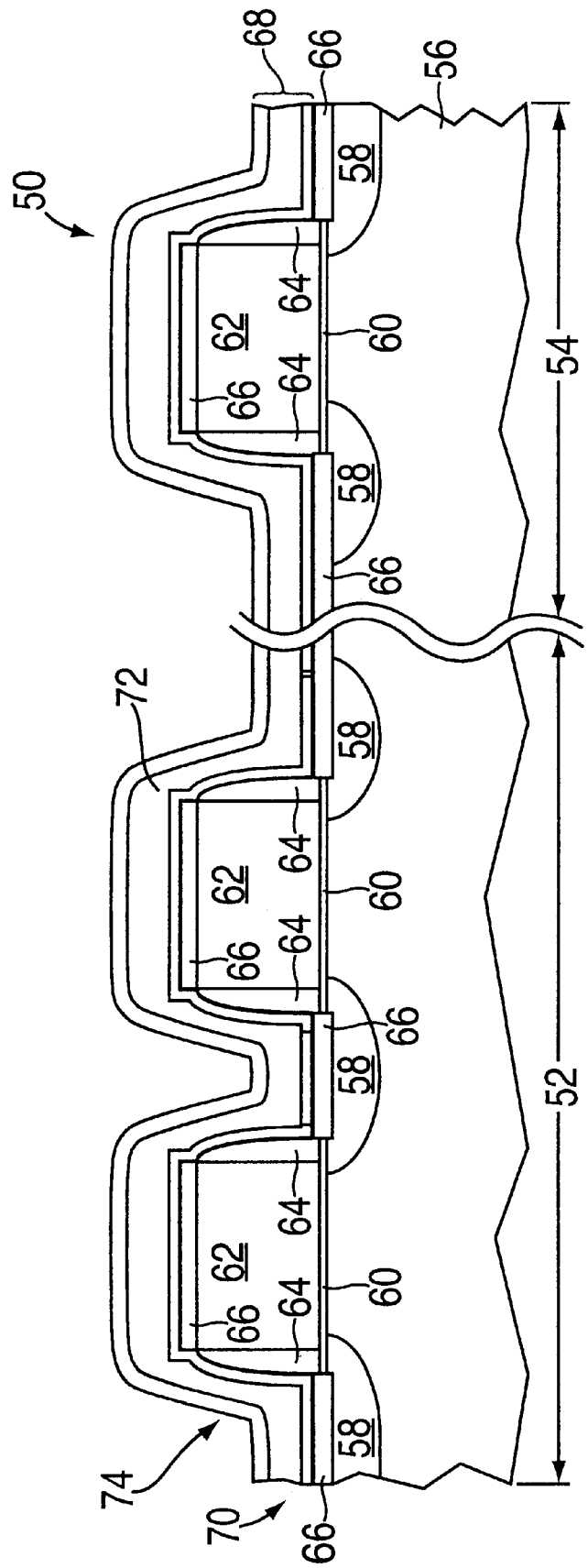

As shown in FIG. 3, material stack 68 is formed on the structure shown in FIG. 2. Specifically, material stack 68 includes bottom nitride layer 70, polysilicon layer 72, and top nitride layer 74. In accordance with the present invention, each layer of material stack 68 is formed sequentially by a conventional deposition process such as CVD, plasma-assisted CVD, sputtering, evaporation, chemical solution deposition and other like deposition processes. The bottom nitride layer, e.g., layer 70, of material stack 68 is a thin nitride layer which has a thickness of from about 4 to about 20 nm, with a thickness of from about 5 to about 10 nm being more highly preferred. The polysilicon layer of material stack 68 is then formed on the bottom nitride layer utilizing a conformal deposition process to a thickness of from about 10 to about 30 nm, with a thickness of from about 15 to about 25 nm being more highly preferred. The top silicon nitride layer, e.g., layer 74, of material stack 68 has a thickness after deposition of from about 4 to about 20 nm, with a thickness of from about 5 to about 10 nm being more highly preferred.

Figure 4:
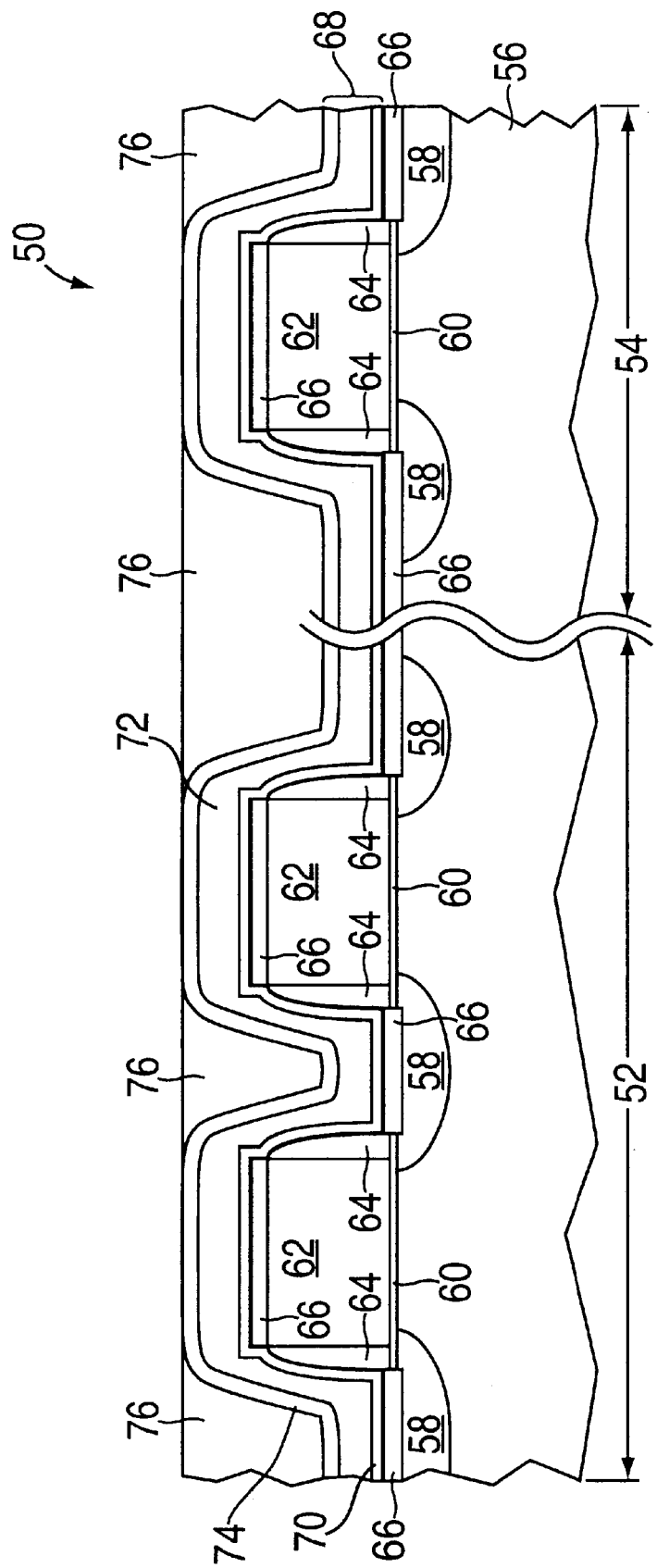

After forming material stack 68 on the structure, planarizing material 76 is formed thereon by a conventional deposition process such as CVD, plasma-assisted CVD, sputtering, evaporation, spin-on coating and chemical solution deposition. Illustrative examples of planarizing materials that can be employed in the present invention include, but are not limited to: a conventional photoresist or a CVD oxide. After forming the planarizing material on the structure, the structure is then subjected to a planarization process which provides the planarized structure, shown, for example, in FIG. 4. Note that the planarization process stops on the uppermost surface of top nitride layer 74 which lays above patterned polysilicon gate conductors 62. In the case of CVD oxide planarizing material, planarization may be achieved by chemical-mechanical polishing (CMP) or grinding. When conventional resists are employed as the planarizing material, planarization spin-on and recess planarization may be employed.

Figure 5:
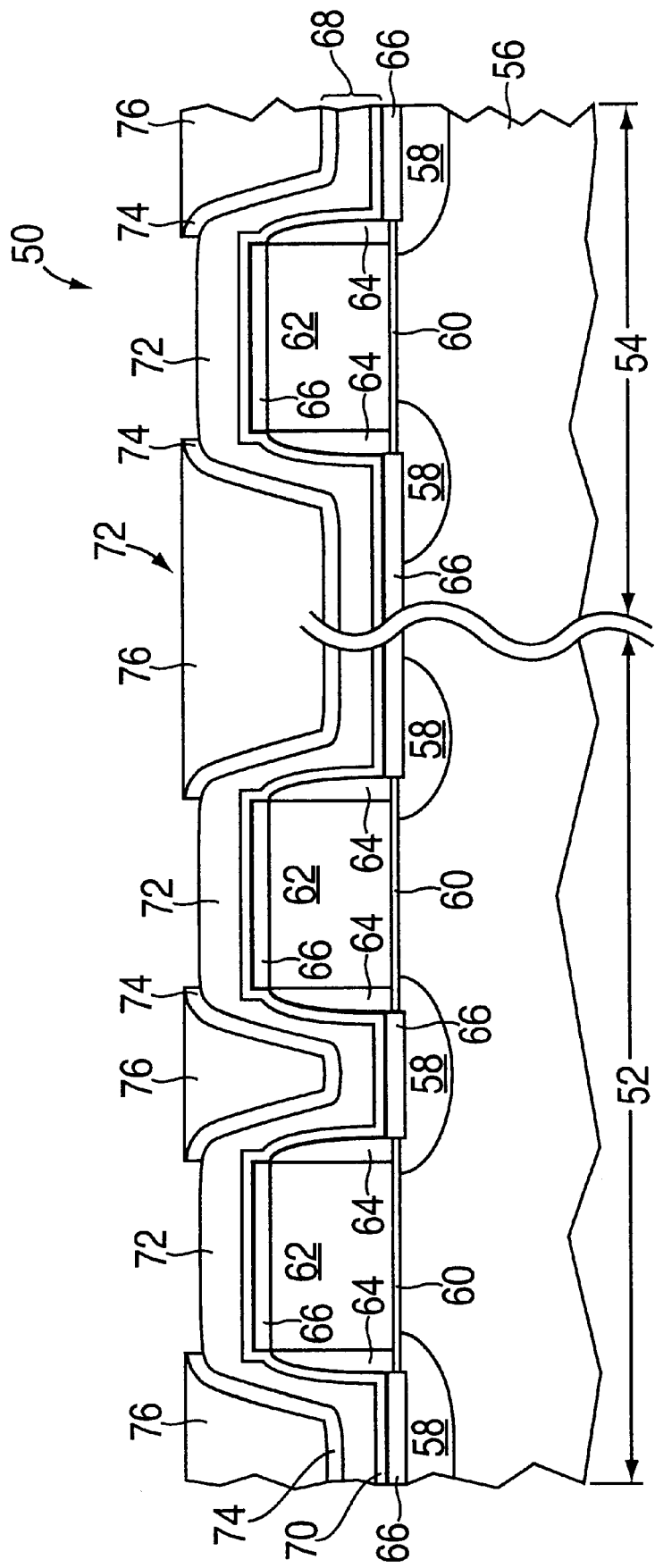

The exposed portions of top nitride layer 74 that is present atop of the patterned polysilicon gate conductors 62 is then removed by employing an etching process that is highly selective to polysilicon so as to provide the structure illustrated in FIG. 5. In optional embodiment of the present invention, a high-dopant concentration may be implanted into the exposed polysilicon gate conductors at this point of the inventive process. The purpose of this optional ion implant into the polysilicon gate conductors is to enhance the rate of oxidation of the polysilicon during a subsequent gate oxidation step.

Figure 6:
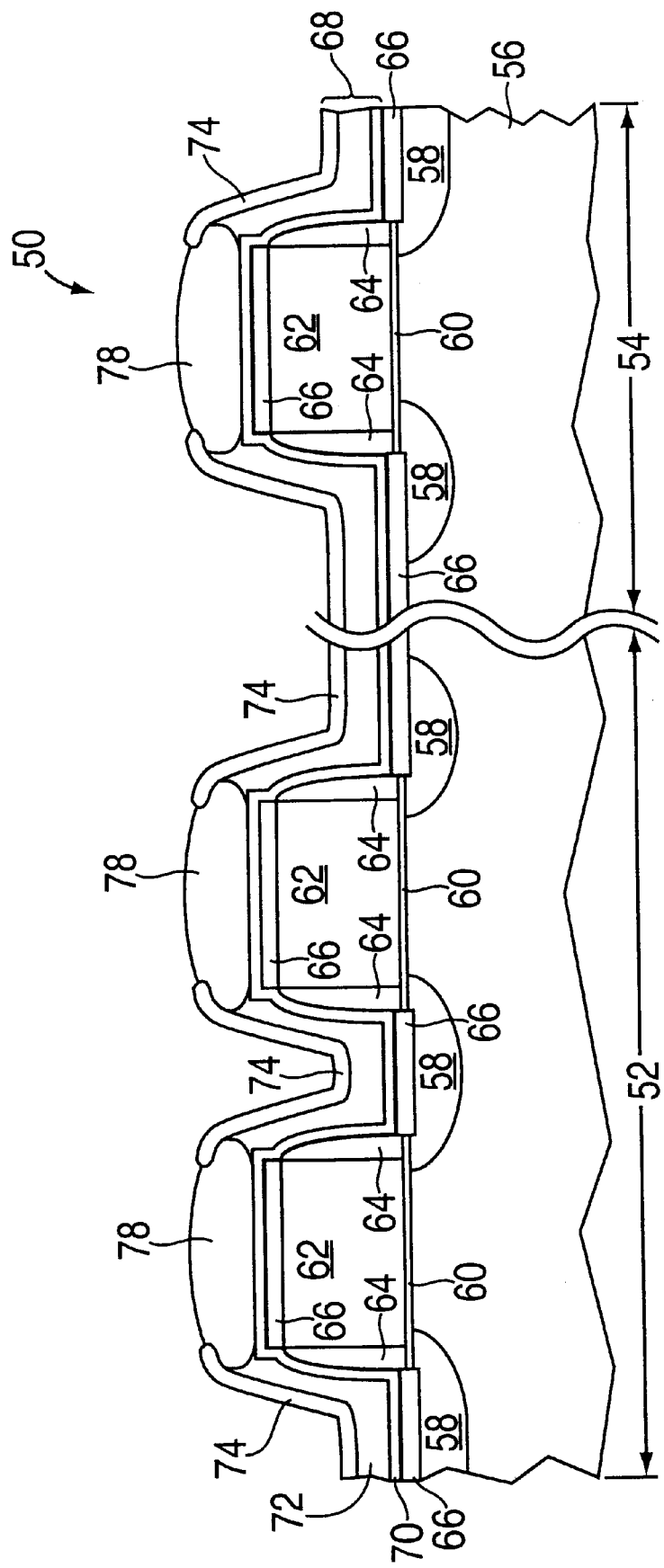

Next, planarizing material 76 is removed selective to polysilicon and nitride and thereafter the exposed portions of polysilicon layer 72 are oxidized so as to provide oxide region 78 above each of the patterned polysilicon gate conductors. The resultant structure following these processing steps is shown, for example, in FIG. 6. In accordance with the present invention, oxide regions 78 are formed utilizing any conventional thermal oxidation process well known to those skilled in the art. In a preferred embodiment of the present invention, oxide regions 78 are formed utilizing a low-temperature (on the order of from about 600° to about 800° C.), high-pressure (on the order of about 2 atmospheres or above) steam oxidation process. Such a process is highly preferred in the present invention since it enhances the oxidation rate without significantly adding to the overall thermal budget of the inventive method. If a dopant was previously implanted into the polysilicon, the oxidation rate may also be enhanced over a conventional thermal oxidation process.

Figure 7:
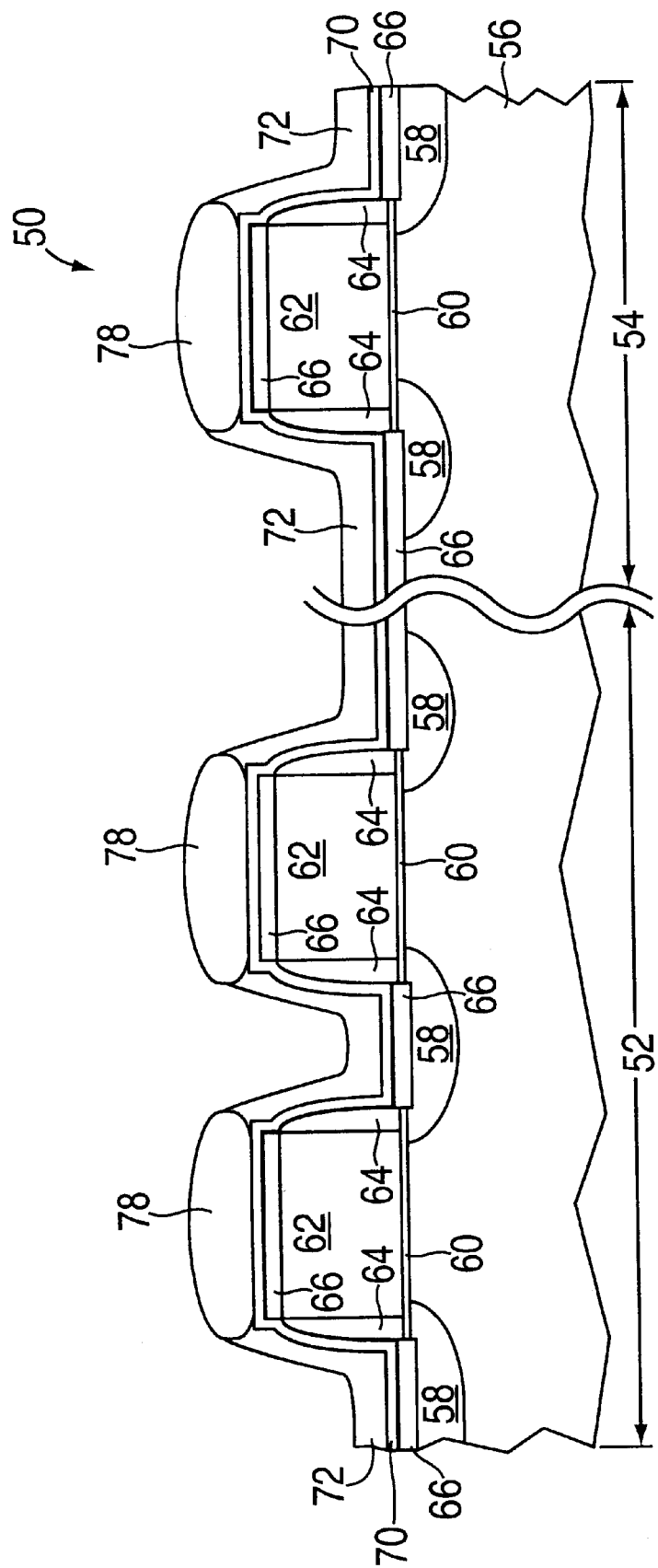

Next, and as shown in FIG. 7, the remaining portion of top nitride layer 74 is removed utilizing an etching process that is highly selective to polysilicon and oxide. For example, hydrofluoric ethylene glycol (HFEG) may be used to remove the top nitride layer from the structure.

Figure 8:
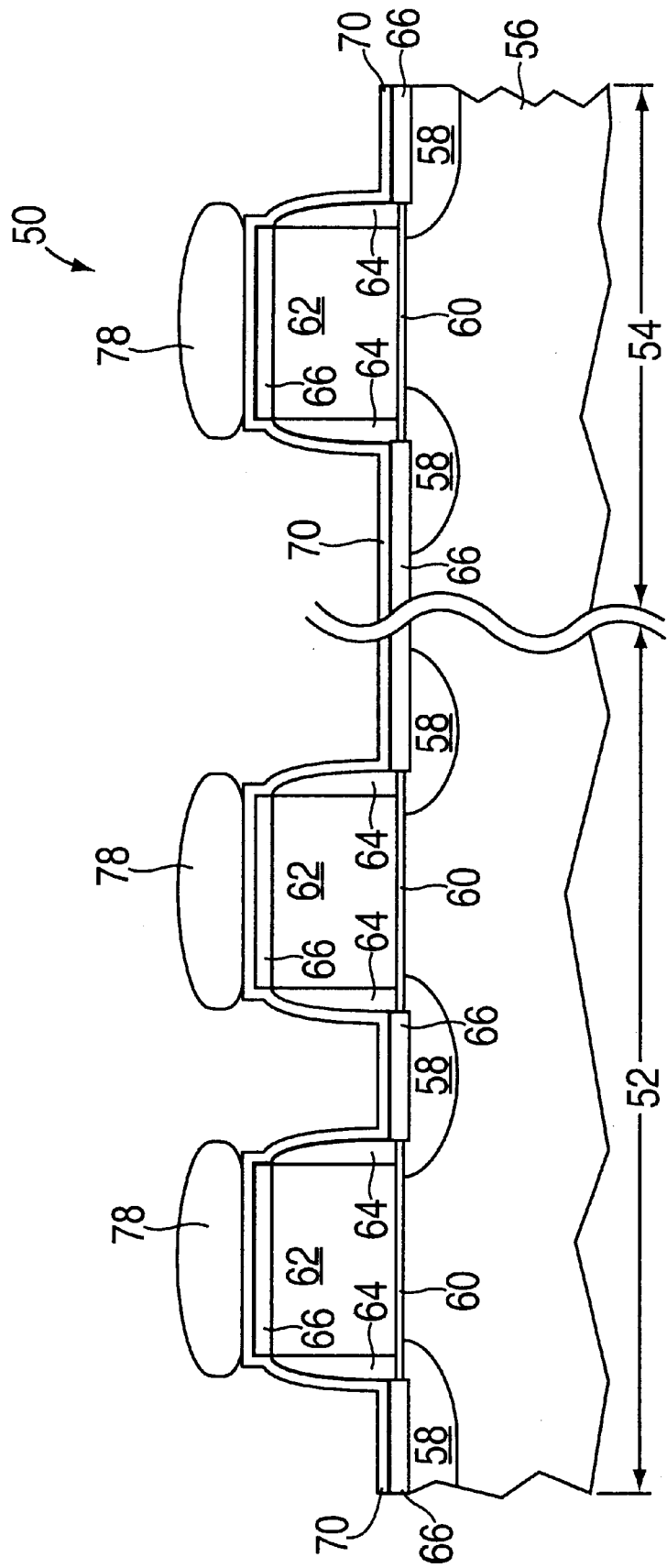

Exposed portions of polysilicon layer 72 is then removed by an etching process that is highly selective to nitride and $SiO_2$ so as to provide the structure shown in FIG. 8. For example, well known isotropic etches such as KOH (wet etch) or $SF_6$ (dry etch) may be used to remove the exposed portions of polysilicon layer 72 from the structure.

Figure 9:
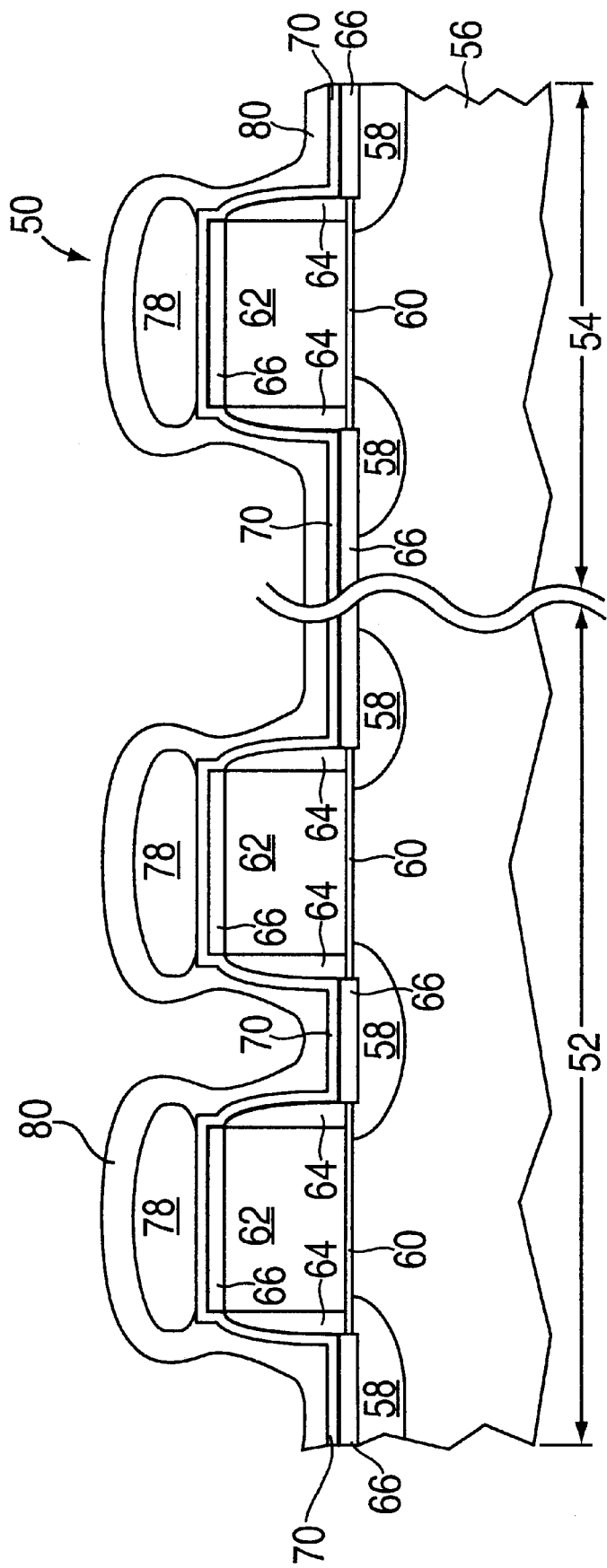
Figure 10:
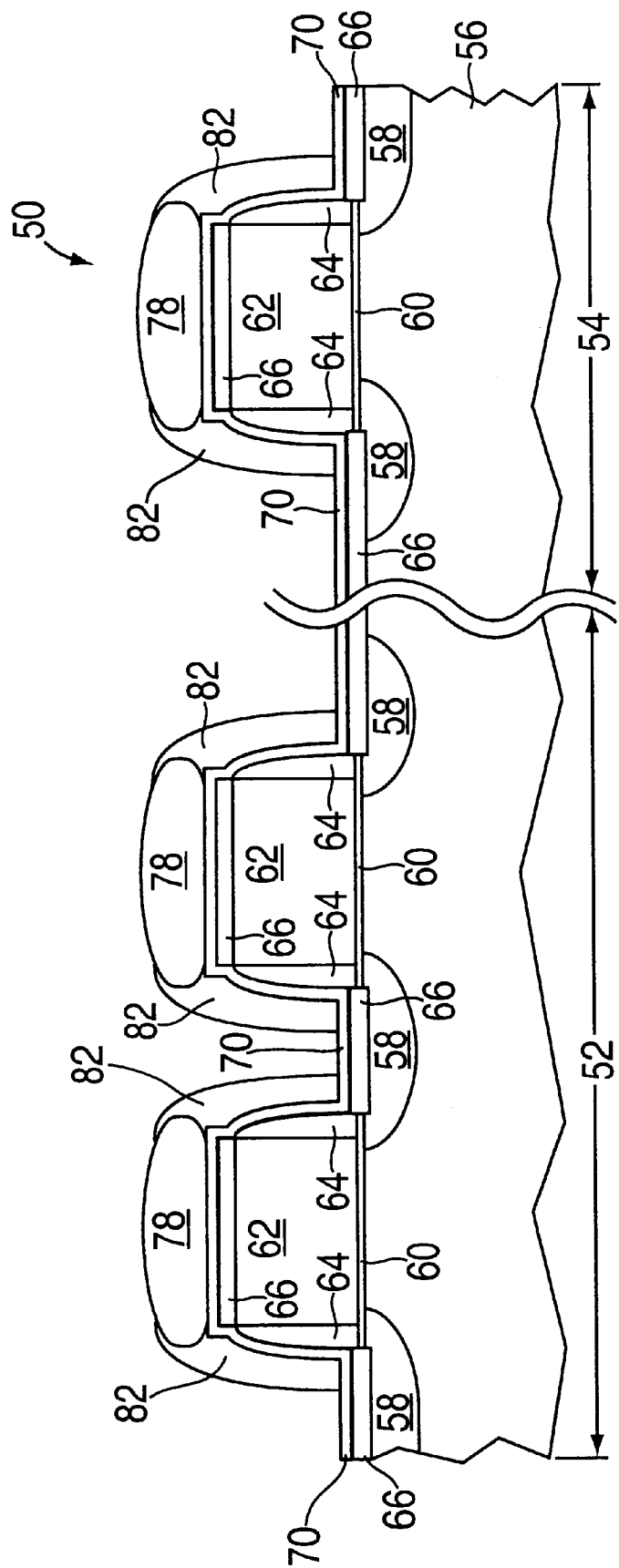

An oxide 80, such as CVD oxide, is then conformally deposited onto the structure shown in FIG. 8 providing the structure shown in FIG. 9. Note that the oxide layer follows the contour of the structure. This oxide layer, i.e., oxide layer 80, is then etched by a conventional etching process such as RIE so as to form oxide spacers 82 on the structure; See FIG. 10. Note that spacers 82 have a geometry that is squared off due to the top oxide cap, i.e., oxide region 78, that overhangs the gate conductor edge. The combination of oxide cap, i.e., oxide region 78, and oxide spacers 82 results in significant capacitance reduction relative to the prior art which uses SiN for both the gate conductor cap and the gate conductor spacers.

Figure 11:
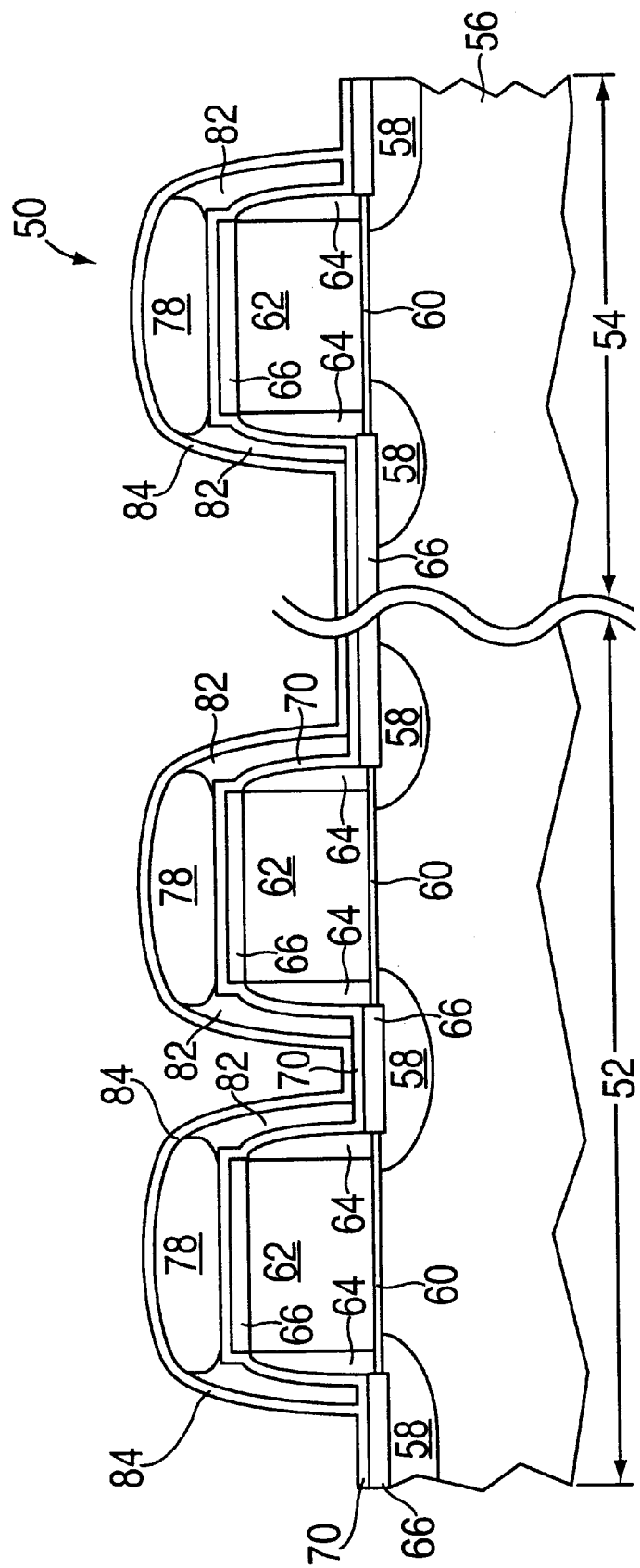

A third nitride layer, i.e., layer 84 in FIG. 11, is then conformally deposited on the structure utilizing any conventional conformal deposition process such as CVD. Third nitride layer 84 serves as an etch stop layer for subsequent via etching through a planarized glass layer.

Figure 12:
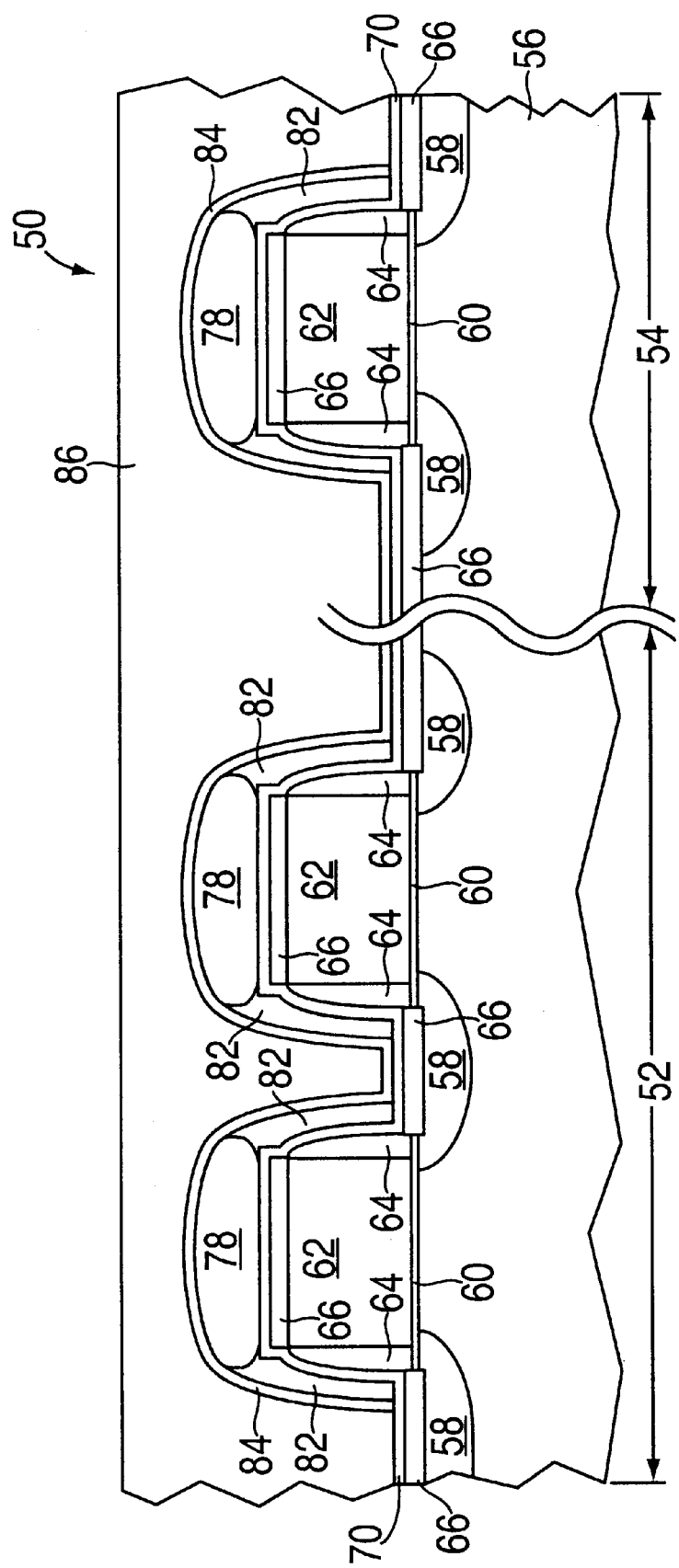

A planarizing layer of glass material 86 such as boron-phosphorus doped silicate glass (BPSG), boron doped silicate glass (BSG) or arsenic doped silicate glass (ASG) is then deposited over the entire structure providing the planarized structure shown in FIG. 12. The planarizing layer is formed utilizing any conventional deposition process such as CVD.

Figure 13:
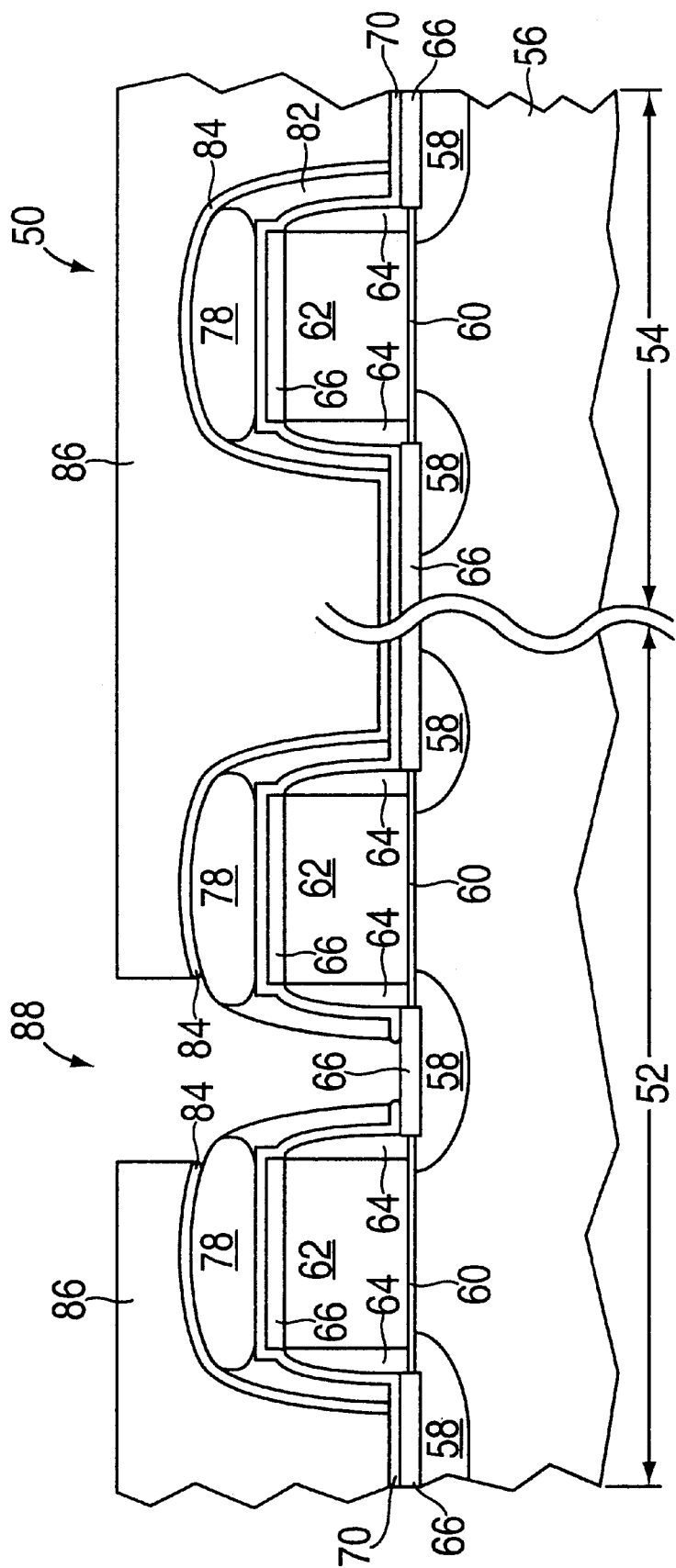

Using the borderless contact to diffusion mask provided by the above processing steps, openings 88 (one of which is shown in the drawings) are etched in the array device region utilizing a dry etching process such as RIE through planarizing layer 86 selective to nitride. The exposed portion of third nitride layer 84 is then etched open selective to oxide and silicon, thereby exposing the contact area over one of diffusion regions 58. The resultant structure including opening 88 is shown, for example, in FIG. 13. Note that the borderless contact to diffusion mask overlaps the gate electrode since the oxide cap and spacers prevents diffusion stud to gate conductor shorts.

Following formation of openings 88 to the contact areas of the structure, contact stud 90 material such as W, Pt. Cu, Ti, Ta and polysilicon is deposited by a conventional deposition process such as CVD, plasma-assisted CVD, plating, evaporation and chemical solution deposition. Following deposition, the contact stud material is planarized to the surface of planarizing material 86 so as to provide the structure shown in FIG. 14.

Figure 14:
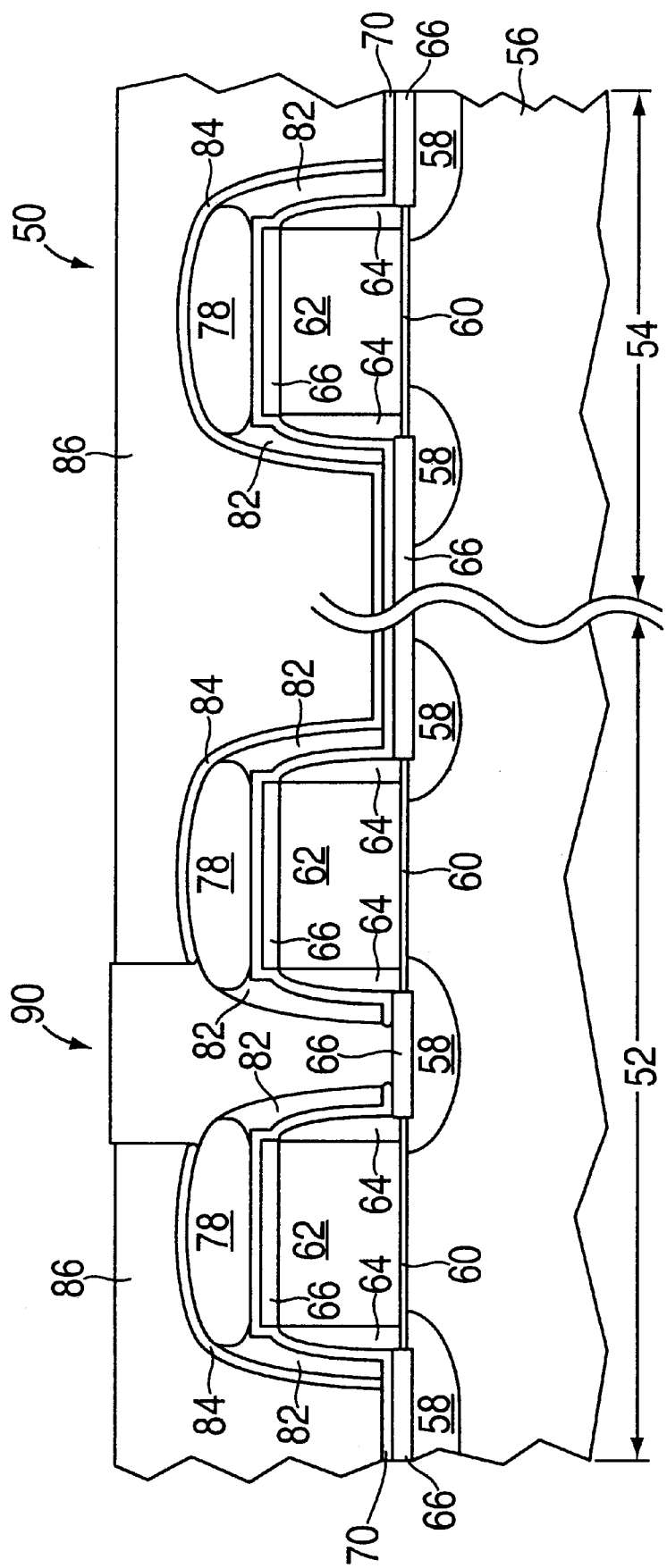

Standard processing continues on the structure shown in FIG. 14, including formation of higher level wiring regions and insulating layers.

While the present invention has been particularly shown and described with respect to preferred embodiments thereof, it will be understood by those skilled in the art that the foregoing and other changes in form and detail may be may without departing from the spirit and scope of the present invention. It is therefore intended that the present invention not be limited to the exact forms and details described and illustrated, but fall within the spirit and scope of the present invention.

Having thus described our invention in detail, what we claim as new and desire to secure by the Letters Patent is:

1. A method of forming a dual workfunction MOSFET comprising the steps of:
   (a) providing a semiconductor structure which includes at least one array device region and at least one support device region, wherein each of said regions includes patterned polysilicon gate conductors, and salicide regions formed over at least diffusion regions that are formed in a surface of a semiconductor substrate between said patterned polysilicon gate conductors;
   (b) forming a material stack on said semiconductor structure, said material stack comprising a bottom nitride layer formed on all exposed surfaces of said semiconductor structure, a polysilicon layer formed on said bottom nitride layer, and a top nitride layer formed on said polysilicon layer;
   (c) forming a planarizing material on said material stack and planarizing said planarizing material so as to expose said top nitride layer that is present above said patterned polysilicon gate conductors;
   (d) removing exposed portions of said top nitride layer so as to expose portions of said polysilicon layer that is present above said patterned polysilicon gate conductors;
   (e) removing said planarizing material and forming an oxide region on exposed portions of said polysilicon layer that is present above said patterned polysilicon gate conductors;
   (f) removing said top nitride layer and said polysilicon layer that abut said oxide region so as to expose said first nitride layer of said material stack;
   (g) forming oxide spacers abutting said patterned polysilicon gate conductors;
   (h) forming a third nitride layer on all exposed surfaces of said semiconductor structure;
   (i) forming a planarized layer of glass material on said third nitride layer;
   (j) providing an opening in said semiconductor structure between adjacent patterned polysilicon gate conductors in said at least one array device region so as to expose said salicide region formed on one of said diffusion regions; and
   (k) forming a borderless diffusion contact within said opening.

2. The method of claim 1 wherein step (a) comprises the steps of forming a gate dielectric on said surface of said semiconductor substrate; forming a polysilicon layer on said gate dielectric; patterning said polysilicon layer by lithography and etching; forming insulating spacers on said exposed sidewalls of said patterned polysilicon gate conductors; implanting dopants within said surface of said semiconductor substrate in regions abutting said patterned polysilicon gate conductors; removing portions of said gate dielectric above said diffusion regions; forming a refractory metal on said diffusion regions and said patterned polysilicon gate conductors and annealing said refractory metal so as to convert the same into a refractory metal salicide.

3. The method of claim 1 wherein said patterned polysilicon gate conductors are doped.

4. The method of claim 1 wherein said semiconductor substrate is selected from the group consisting of Si, Ge, SiGe, GaAs, InAs, InP, Si/SiGe and silicon-on-insulators.

5. The method of claim 2 wherein said gate dielectric is an oxide, nitride, oxynitride or any combination thereof.

6. The method of claim 2 wherein said gate dielectric is formed by a thermal growing process or by deposition.

7. The method of claim 2 wherein said insulating sidewall spacers are comprised of an oxide, oxynitride or nitride.

8. The method of claim 1 wherein step (b) includes sequential deposition of said bottom nitride, polysilicon and top nitride layers.

9. The method of claim 1 wherein said planarizing material is a photoresist or chemical vapor deposited (CVD) oxide.

10. The method of claim 9 wherein said planarizing material is a CVD oxide and said planarizing step comprises chemical-mechanical polishing.

11. The method of claim 9 wherein said planarizing material is a photoresist and said planarizing step comprises spin-on planarization or recess planarization.

12. The method of claim 1 wherein step (d) includes an etching process that is selective to polysilicon.

13. The method of claim 1 wherein dopants are implanted through said exposed portions of said polysilicon layer so as to enhance oxidation rate of said patterned polysilicon gate conductors.

14. The method of claim 1 wherein said planarizing material is removed using an etching process that is selective to polysilicon and nitride.

15. The method of claim 1 wherein said oxide region of step (d) is formed by a thermal oxidation process.

16. The method of claim 15 wherein said thermal oxidation process includes a low temperature, high-pressure steam oxidation process.

17. The method of claim 1 wherein step (f) comprises an etching process that is highly selective to polysilicon and oxide.

18. The method of claim 1 wherein step (g) comprises forming a conformal oxide layer and etching said conformal oxide layer forming said spacers that have a geometry that is squared off.

19. The method of claim 1 wherein said glass material comprises boron-phosphorous doped silicate glass, arsenic doped silicate glass, or boron doped silicate glass.

20. The method of claim 1 wherein said openings are provided by at least one etching process that is capable of exposing said salicide regions.

21. The method of claim 1 wherein said borderless diffusion contacts are formed by depositing a contact stud material into said openings, and planarizing said contact stud material stopping on said planarizing glass material.

22. The method of claim 21 wherein said contact stud material is comprised of W, Pt, Cu, Ti, Ta or polysilicon.

* * * * *